United States Patent [19]

Shibamata et al.

[11] 4,449,037
[45] May 15, 1984

[54] METHOD AND APPARATUS FOR HEATING SEMICONDUCTOR WAFERS

[75] Inventors: Yoshiyuki Shibamata, Machida; Hideo Onodera, Kawasaki; Tadashi Kiriseko, Kanagawa, all of Japan

[73] Assignee: Fujitsu Limited, Kawasaki, Japan

[21] Appl. No.: 378,261

[22] Filed: May 14, 1982

Related U.S. Application Data

[63] Continuation of Ser. No. 88,463, Oct. 26, 1979, abandoned.

[30] Foreign Application Priority Data

Oct. 31, 1978 [JP] Japan .................................. 53-134140

[51] Int. Cl.³ ........................ F27B 9/06; C23C 13/08
[52] U.S. Cl. .................... 219/388; 219/10.43; 219/10.49 R; 219/10.69; 118/725; 118/50.1; 427/45.1; 427/49
[58] Field of Search ............... 219/10.49 R, 10.43, 219/10.41, 10.67, 10.69, 10.79, 388, 390; 118/725, 727, 729, 50.1, 620, 641, 733; 427/45.1, 49, 50, 51, 82; 148/174, 175, 189

[56] References Cited

U.S. PATENT DOCUMENTS

| | | | |
|---|---|---|---|
| 3,031,338 | 4/1962 | Bourdeau | 118/725 X |
| 3,524,776 | 8/1970 | Hampikian et al. | 148/189 |
| 3,657,006 | 4/1972 | Fisher et al. | 118/729 |
| 3,828,722 | 8/1974 | Reuter et al. | 118/729 X |
| 3,893,876 | 7/1975 | Akai et al. | 118/729 X |
| 3,900,597 | 8/1975 | Chruma et al. | 427/82 |
| 4,033,286 | 7/1977 | Chern et al. | 118/725 |
| 4,129,090 | 12/1978 | Inaniwa et al. | 118/733 X |
| 4,147,432 | 4/1979 | Yamawaki et al. | 118/725 |
| 4,275,094 | 6/1981 | Takagi et al. | 118/733 X |

Primary Examiner—B. A. Reynolds
Assistant Examiner—Philip H. Leung
Attorney, Agent, or Firm—Staas & Halsey

[57] ABSTRACT

A system and method for evenly heating semiconductor wafers in a horizontal elongated reaction tube, wherein a furnace surrounding only a part of the length of the reaction tube is caused to move so as to pass along each wafer placed in the reaction tube. The system is especially useful for processing wafers at high temperatures for a short period of time.

22 Claims, 4 Drawing Figures

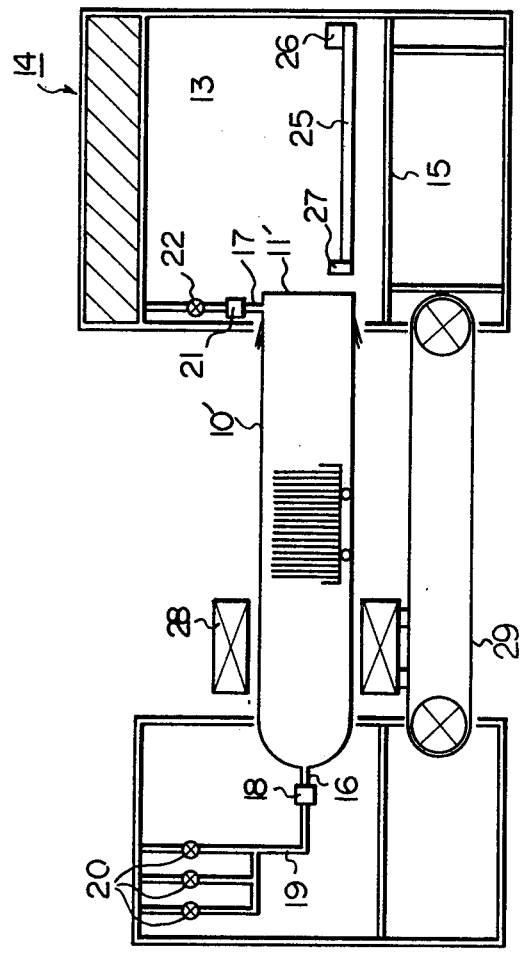

METHOD AND APPARATUS FOR HEATING SEMICONDUCTOR WAFERS

This is a continuation of application Ser. No. 088,463 filed Oct. 26, 1979 now abandoned.

BACKGROUND OF THE INVENTION

The present invention relates to a method for heating semiconductor wafers and to an apparatus for carrying out such a method.

Processes for manufacturing semiconductor devices involve steps in which an impurity is diffused into a wafer, or a coating is formed on at least one surface of a wafer. Generally, such a diffusion of an impurity or a formation of a coating is effected by heating a wafer in an atmosphere within a reaction tube. Heating is achieved by a furnace surrounding the tube. More specifically, an elongated reaction tube is horizontally placed in a furnace surrounding the effective length of the reaction tube, and heated to a predetermined temperature. An appropriate gas, such as $N_2$, $O_2$ or $H_2$, is allowed to pass through the reaction tube to establish a desired atmosphere. Arrays of wafers supported by a holder are then introduced into the reaction tube from one end thereof, allowed to stay there for a predetermined period of time, and then withdrawn from the same end of the tube. By such a heating procedure, an even heating cannot be effected because the integrated heat quantity is different not only from wafer to wafer but, also, from portion to portion in each wafer.

Solutions to the above-mentioned problem are proposed in Japanese Patent Publications No. 43-26809 (claiming a convention priority from a U.S. application Ser. No. 529,288, of Feb. 23, 1966), published on Nov. 18, 1968, No. 48-22540, published on July 6, 1973, and No. 49-26457, published on July 9, 1974. According to these prior art solutions, wafers are passed on wafer holders through an elongated reaction tube heated by a furnace surrounding the tube. Such a prior art approach poses, however, the following problems, which are practically very difficult to overcome. First of all, the wafer holders must be provided with certain mechanical means, such as pinions, for their movement through the heated reaction tube. Such mechanical means must be made of a material resistive to a high temperature at which the wafers are to be processed. If the processing temperature is higher than about 900° C., refractory metal materials can not be used for the construction of such mechanical means, because the intended doping is adversely affected due to impurities from such metallic materials. For processing at high temperatures ranging, for example, from 1100° C. to 1250° C., materials such as, quartz, SiC, polycrystalline silicon or $SiN_4$, are required. Due to significant thermal distortion at high temperatures and poor fabrication precision of such materials, a smooth movement of the wafers through the high temperature zone is not ensured. Secondly, since the wafers and holders are always moving together with the mechanical means, formation of dust is unavoidable, leading to a reduction in the yield (i.e., an increased production of faulty products). Thirdly, if an endless transporter conveyor system is adopted for the purpose of mass production, it is difficult to protect the wafers and holders from dust when they are moving outside the furnace. For the reasons discussed above, the prior art system in which wafers are moved through an elongated reaction tube, has a limited application and is not applicable to cases wherein a shallow diffusion is desired, as is the case with annealing after ion implantation, or to cases wherein a quick processing at high temperatures (e.g., 1100° C. to 1250° C.) is intended.

SUMMARY OF THE INVENTION

An object of the invention is to provide an improved method for evenly heating semiconductor wafers, which has unlimited applications without suffering from the problems discussed above.

Another object of the invention is to provide a novel apparatus for evenly heating semiconductor wafers.

In one aspect of the invention there is provided a method for heating semiconductor wafers wherein semiconductor wafers are externally heated in an atmosphere within an elongated reaction zone, characterized in that a heating means surrounding a part of the length of the reaction zone is moved so that it will pass over each wafer placed in the reaction zone, thereby evenly heating the wafers.

In another aspect of the invention there is provided an apparatus for heating semiconductor wafers comprising an elongated reaction tube, a holder for supporting wafers to be heated, a furnace for externally heating the reaction tube, and means for introducing the holder into the reaction tube and for withdrawing the holder from the reaction tube, characterized in that said furnace surrounds a part of the length of said reaction tube and that means for moving said furnace along said reaction tube is further provided.

BRIEF EXPLANATION OF THE DRAWINGS

FIG. 4 is a schematic vertical cross-sectional view of an apparatus in accordance with another embodiment of the invention.

DETAILED DESCRIPTION OF THE INVENTION

Figure 1:
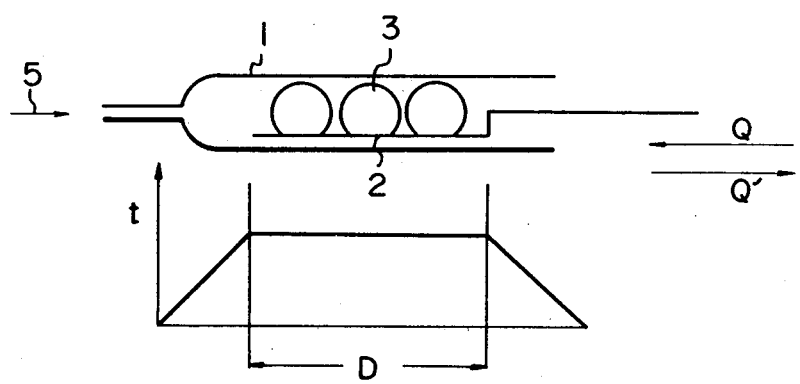
FIG. 1 is a schematic axial section of a reaction tube for illustrating a conventional method for heating wafers. The temperature distribution provided by the fixed electric furnace which is used to heat the tube is also shown in FIG. 1.

Referring to FIG. 1, in a conventional method an elongated reaction tube 1 is horizontally placed in a fixed electric furnace (not shown) surrounding the tube and heated to a predetermined temperature. The furnace is such that it provides a heating zone exhibiting a temperature profile having a flat portion D, as shown in FIG. 1. A gas 5 to establish a desired atmosphere is then allowed to pass through the reaction tube 1. A wafer holder 2 carrying three arrays of wafers 3 is then introduced into the reaction tube 1 from a direction indicated by an arrow Q. All the wafers should be placed in those areas of the reaction tube 1 which correspond to the flat portion D of the temperature profile of the furnace. At the end of a predetermined processing time, the wafer holder 2 carrying the arrays of wafers 3 is withdrawn from the heated reaction tube in a reverse direction indicated by an arrow Q'. In this heating procedure, it will be understood that wafers in the left end array receive more heat than those in the right end array. Furthermore, the integrated heat quantity is different from portion to portion in a single wafer. Uneven heating of wafers results in variations in the sheet resistivity, thickness of oxide coating, current amplification factor, cut off frequency and/or other properties of the semiconductor device products.

Figure 2:
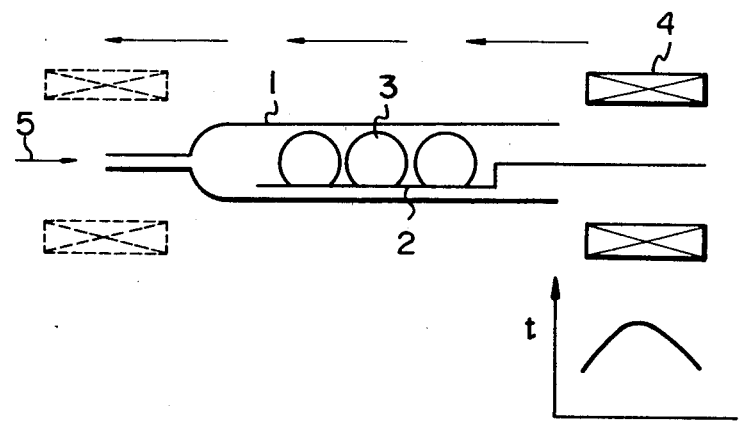
FIG. 2 is a schematic axial section of a reaction tube for illustrating a method according to the invention. The temperature distribution provided by the movable electric furnace which is used to heat the tube, when it is stationary, is also shown in FIG. 2.

The method of the invention will now be described with reference to FIG. 2, in which the same numerals designate similar types of parts as those shown in FIG. 1. In a method in accordance with the invention a gas is allowed to pass through a horizontal elongated reaction tube 1. The tube 1 may be at ambient temperature, or may be preheated to a temperature of several hundreds degrees C., at which the intended reaction does not yet take place. A wafer holder 2 carrying arrays of wafers is then introduced into the center of the reaction tube 1 from one end of the tube 1. A movable electric furnace 4 surrounding a part of the whole length of the reaction tube, which is movable along the reaction tube 1 is initially placed at that end of the tube 1 into which the wafers 3 have been introduced and then caused to move in the direction designated by the three arrows in FIG. 2, so that it will pass over each wafer placed in the tube 1 and reach the other end of the tube 1 as shown by the broken lines. By this heating procedure according to the invention, the wafers can be evenly heated. While an electric furnace is preferred, other furnaces such as a high frequency furnace and an infrared furnace can also be used in the practice of the invention. In preferred embodiments, a heating zone formed by the furnace 4, when it is stationary, is such that it exhibits a temperature distribution or profile along the length, as shown in FIG. 2, having a distinct peak at the center of the temperature profile. It is preferable to move the furnace at a constant speed. In these preferred embodiments, properties of the products including, for example, the deepness of diffusion, sheet resistivity, and thickness of oxide coating, may be controlled by appropriately selecting the peak temperature of the furnace and the moving speed of the furnace. In most cases, the peak temperature of the furnace is selected within the range between 1,000° C. and 1,250° C., and the moving speed of the furnace within the range between 10 cm/min and 100 cm/min. In some embodiments, the furnace may be caused to move from one end of the reaction tube to the center of the tube, where it may be stopped for a certain period of time, and thereafter, the furnace may be caused to move from the center of the furnace to the other end of the furnace. For such a heating procedure, the furnace must be sufficiently long to form a heating zone exhibiting a temperature distribution along the length thereof with a flat portion, as shown in FIG. 1. Such a heating procedure is not preferable, although it is not impossible to carry out.

Figure 3:
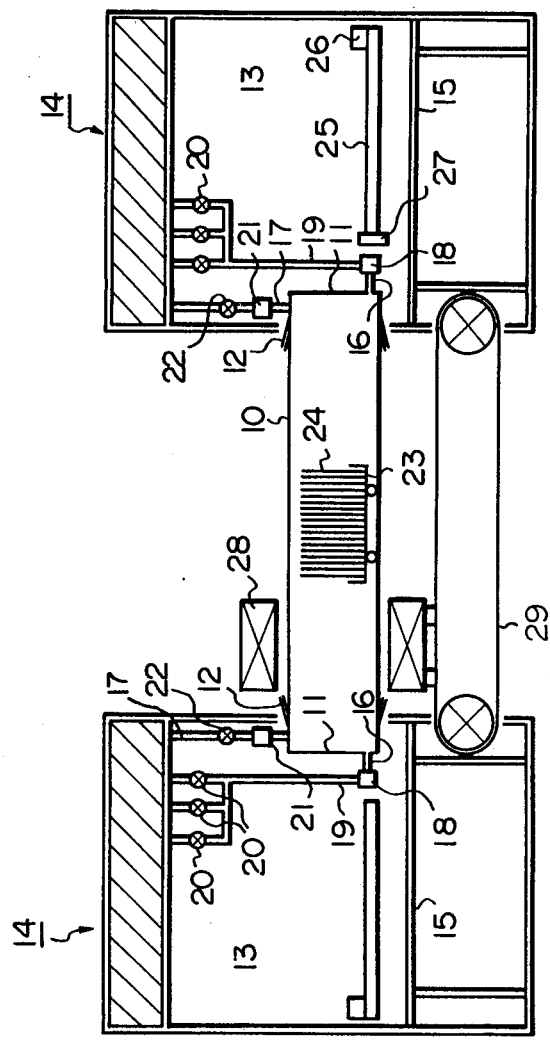
FIG. 3 is a schematic vertical cross-sectional view of an apparatus in accordance with one embodiment of the invention.

The apparatus for heating wafers shown in FIG. 3, in accordance with one embodiment of the invention, comprises a horizontal elongated cylindrical reaction tube 10. The tube 10 is made of quartz glass and has caps 11 of quartz glass detachably mounted at both ends thereof. The cap 11 is attachable to one end of the tube 10, by a ground glass fitting 12 forming a gas tight connection. When the cap 11 is detached from the end of the tube 10, the tube 10 opens at that end to a space 13 within a clean bench generally designated by the numeral 14. There is a table 15 within the clean bench 14, on which a worker may handle wafers before and after the treatment. Each cap 11 is provided with a gas inlet pipe 16 and a gas outlet pipe 17. The inlet pipe 16 is connected to a pipe 19 by a joint 18, and the pipe 19 is branched into three pipes, each being communicated, via a valve 20, with each gas source (not shown). The outlet pipe 17 is communicated with a gas exhaust system (not shown) via a joint 21 and valve 22. In each clean bench there is provided means for charging and discharging the reaction tube 10 with a boat 23 carrying wafers 24. Such means may comprise a hollow rotating shaft 25 driven by a motor 26 at one end of the shaft via a worm gear (not shown), a threaded nut 27 axially mounted to the shaft 25 at the other end of the shaft, and a screw rod (not shown) engaged with the nut 27. The rotation of the shaft 25 may be converted to the linear movement of the screw rod, which may be transmitted to a quartz rod (not shown) attached to the screw rod in parallel so as to push or pull the boat 23. The apparatus is further provided with an electric furnace 28 surrounding a part of the length of the reaction tube 10 for heating that part of the tube surrounded by the furnace. Endless chains 29 driven by a motor (not shown) may drive the furnace 28 along the reaction tube 10. When the furnace 28 is stationary it may form a heating zone exhibiting a temperature distribution with no flat portions along the length of the mobile, as shown in FIG. 2.

In the operation of the apparatus shown in FIG. 3, the furnace 28, which is placed at one end (the left end, in the illustrated case) of the reaction tube, is caused to start to heat.

In one clean bench remote from the furnace (the right one, in the illustrated case) the cap 11 is detached from the reaction tube 11 by disconnecting the joints 16 and 21. The wafer boat 23 is withdrawn from the tube 10 and, then, loaded with wafers 24 to be processed. The boat 23 is then placed in the center of the tube 10, and the cap 11 is attached again to the tube in the right clean bench. The required gas is caused to flow through the tube, from the left to the right in the illustrated case, by appropriately adjusting the valves 20 and 22. The furance 28 is then caused to move at a predetermined speed along the reaction tube 10 until it reaches the right end of the tube. The cap 11 in the left clean bench is then removed from the tube, and the boat 23 is withdrawn from the tube to the left clean bench in order to remove the treated wafers. In the next run, fresh wafers may be inserted from the left clean bench and the treated wafers may be removed at the right clean bench. In this run, the furnace 28 is cause to travel along the tube 10 from right to left under a gas flow from right to left.

FIG. 4 illustrates an apparatus in accordance with another embodiment of the invention. In this embodiment, the apparatus comprises a reaction tube 10' having a cap 11' detachably mounted to one end thereof. The cap 11' has only a gas outlet pipe 17 communicated with the gas exhaust system in the same manner as hereinabove described with reference to FIG. 3. The reaction tube 10' has a gas inlet pipe 16 at the other end thereof, which inlet pipe 16 is communicated with the gas supply system in the manner as described with reference to FIG. 3. In FIGS. 3 and 4, the same numerals designate corresponding parts.

In the operation of the apparatus shown in FIG. 4, after the tube 10 is provided with wafers from the clean bench 14, which is located at the right side of the tube, and after the establishment of a gaseous atmosphere in the tube by passing the gas through the tube from left to right, the furnace 28 is caused to travel along the tube from left to right and then from right to left for the processing of one lot of wafers. The wafers so processed are then withdrawn from the reaction tube to the clean bench 14.

While the dimensions of the parts of the apparatus are not critical, the furnace 28 can be as short as about 50 cm in length for the reaction tube 10 of a length of about 2 to 3 m.

While the method and apparatus according to the invention are generally useful for evenly heating semiconductor wafers, they are particularly suitable for use in the treatment of wafers at a high temperature for a short period of time, as is the case with annealing after ion implantation and a solid-to-solid diffusion. For example, in annealing after implantation of $1 \times 10^{14}$ boron ions/cm$^2$ into a n-type (111) Si substrate of 1 $\Omega$m, the junction depth of the order of 3000 Å and the sheet resistivity of 950 $\Omega$/square can be achieved by a conventional method using the annealing conditions of 1000° C., 30 minutes, in $N_2$. Whereas, in accordance with the invention, the same order of the junction depth and the sheet resistivity of 900 $\Omega$/square can be achieved using the peak temperature of 1180° C. and the moving speed of 30 cm/min. This reveals that better activation of implanted atoms is achievable in accordance with the invention than with the conventional method. In a quick diffusion technique involving rapid heating and rapid cooling of a single wafer, a wafer 4 inches in diameter tends to crack if it is repeatedly subjected to such a quick diffusion processing 3 to 4 times. This is not the case if such a wafer is treated in accordance with the invention. In still another example of an emitter diffusion based on solid-to-solid diffusion of P from phosphrus silicate glass in $O_2$, the same orders of the current amplification factor and the cut off frequency can be achieved either by a quick diffusion technique with the furnace temperature of 1150° C., the boat loader speed of 300 cm/min and the diffusion time of 90 seconds, or by a method of the invention with the peak temperature of 1180° C. and the moving speed of the furnace of 25 cm/min. The total processing time required for the treatment of 50 wafers is about 90 min. for the quick diffusion technique and about 10 min. for the method of the invention.

What is claimed is:

1. A method for radiation heating semiconductor wafers comprising the steps of:
   positioning a plurality of semiconductor wafers in a substantially vertical arrangement and substantially in parallel spacing to each other in an atmosphere within a horizontally disposed elongated reaction zone, with the main faces of the wafers being substantially perpendicular to the longitudinal axis of the horizontally disposed reaction zone, and
   continuously moving along the longitudinal axis of the reaction zone a short radiation heating means, said heating means surrounding only a small part of the length of the reaction zone, forming a heating zone exhibiting when stationary a temperature profile with no flat portions along its length, moving at a speed of 10 cm/min. to 100 cm/min. relative to the wafers, having a high heating temperature relative to a stationary heating means varied depending upon the moving speed of the short radiation heating means, and passing over each wafer placed in the reaction zone, thereby rapidly, evenly heating the vertically-arranged wafers directly by radiation.

2. A method in accordance with claim 1 wherein said heating means is caused to move at a constant speed.

3. An apparatus for radiation heating semiconductor wafers comprising: a horizontally disposed elongated tube, a holder holding a plurality of wafers to be heated in a substantially vertical arrangement and substantially in parallel spacing to each other, with the main faces of the wafers being substantially perpendicular to the longitudinal axis of the horizontally disposed reaction tube, means for introducing the holder into the reaction tube and for withdrawing the holder from the reaction tube, a furnace for externally heating the wafers directly by radiation that are positioned within the reaction tube, said furnace being short and surrounding only a small part of the length of said reaction tube, forming a heating zone when the furnace is stationary which exhibits a temperature profile with no flat portions along the heating zone length and having a high heating temperature relative to a stationary heating means, and means continuously moving said furnace along the longitudinal axis of the said reaction tube at a speed of 10 cm/min. to 100 cm/min.

4. An apparatus for radiation heating semiconductor wafers comprising:
   (a) a horizontally disposed elongated reaction tube;
   (b) a holder holding a plurality of wafers to be heated, said holder holding the wafers in a substantially vertical arrangement and substantially in parallel spacing to each other, with the main faces of the wafers being substantially perpendicular to the longitudinal axis of the horizontally disposed reaction tube, and said holder being insertable and withdrawable from said reaction tube; and
   (c) radiation furnace means for evenly heating by radiation said wafers contained in said reaction tube, wherein said furnace means is a short heating means surrounding only a small part of the length of said reaction tube and is continuously movable at a speed of 10 cm/min. to 100 cm/min. along the longitudinal axis of the said reaction tube to heat that part of said tube surrounded by said furnace means and wherein said furnace means has a heating zone when stationary exhibiting a peaked temperature profile curve with no flat portions along the profile length and has a high heating temperature relative to a stationary heating means.

5. The apparatus of claim 4 further comprising means for selectively moving said furnace means along said reaction tube.

6. The apparatus of claim 5 wherein said furnace means is moved by said moving means at a predetermined speed.

7. The apparatus of claim 5 wherein said furnace means is moved by said moving means at a predetermined constant speed.

8. The apparatus of claim 5 further comprising mechanical means for introducing the wafer holder into the reaction tube and for withdrawing the wafer holder from the reaction tube positioned adjacent at least one open end of said tube.

9. The apparatus of claim 4 or 8, wherein the horizontally-positioned elongated reaction tube has a closed end and an opposite open end for inserting and withdrawing the wafer holder and wherein the apparatus further comprises cap means for sealingly closing the open end of said reaction tube, gas inlet means connected to the closed end of said tube and gas outlet means connected to the open end of said tube for providing a flow of gas through the tube, and wherein said furnace moves from a pre-heat position adjacent the closed end of said tube along the tube to the open end of said tube and back along the tube to the closed end.

10. The apparatus of claim 4, wherein the horizontally-positioned elongated reaction tube has opposite open ends for inserting and withdrawing the wafer holder and wherein the apparatus further comprises cap means for sealingly closing the opposite ends of said reaction tube.

11. The apparatus of claim 10 further comprising mechanical means positioned adjacent both opposite ends of said tube for introducing the wafer holder into the reaction tube and for withdrawing the wafer holder from the reaction tube.

12. The apparatus of claim 10, wherein said furnace moves from a pre-heat position adjacent the end of said reaction tube through which the wafer holder is withdrawn along the reaction tube to a post-heat position adjacent the opposite end of said reaction tube through which the wafer holder is inserted.

13. The apparatus of claim 12 further comprising gas inlet and outlet means connected to both ends of said reaction tube for introducing gas into the tube and withdrawing gas from the tube, wherein said gas is introduced at the tube end where the furnace is in the pre-heat position, flows in the tube, and is withdrawn at the opposite tube end where the furnace is in the post-heat position.

14. A method for radiation heating semiconductor wafers comprising the steps of:
(a) positioning a plurality of semiconductor wafers in a substantially vertical arrangement and substantially in parallel spacing to each other in a horizontally disposed elongated reaction tube, with the main faces of the wafers being substantially perpendicular to the longitudinal axis of the horizontally disposed reaction tube;
(b) moving a short radiation heating means surrounding only a small part of the length of the elongated reaction tube along the longitudinal axis of the tube at a speed of from 10 cm/min. to 100 cm/min. for continuously passing over and evenly heating by radiation the vertically-arranged wafers positioned in the tube, wherein said heating means when stationary has a heating zone exhibiting a peaked temperature profile curve with no flat portions along the profile length and has a high heating temperature relative to a stationary heating means; and
(c) withdrawing the semiconductor wafers from the elongated reaction tube.

15. The method of claim 14, wherein the elongated reaction tube has only one open end and wherein the heating means moves from an initial pre-heat position adjacent the closed end of the tube along the tube to the open end of the tube and back along the tube to the closed end.

16. The method of claim 14, wherein said heating means is moved at a constant speed along the tube.

17. The method of claim 16 further comprising the step of flowing gas through the tube during external heating from the closed end to the open end of the tube.

18. The method of claim 14, wherein the elongated reaction tube has opposite open ends and wherein the wafers are positioned in the tube from one end and withdrawn from the tube from the other end.

19. The method of claim 18, wherein said wafers are placed in a holder for positioning in and withdrawal from the tube and wherein said positioning and withdrawing of the wafer holder is achieved by mechanical means adjacent both the opposite open ends of the tube.

20. The method of claim 19, wherein the heating means moves from an initial pre-heat position adjacent the open end of the tube from which the wafer holder is withdrawn along the tube to a post-heat position adjacent the open end of the tube into which the wafer holder was positioned.

21. The method of claim 20 further comprising the step of flowing gas through the tube during external heating from one end of the tube to the other.

22. The method of claim 21, wherein the gas flows from the end of the tube where the furnace is in the pre-heat position to the other end of the tube where the furnace is in the post-heat position.

* * * * *

UNITED STATES PATENT AND TRADEMARK OFFICE
CERTIFICATE OF CORRECTION

PATENT NO. : 4,449,037
DATED : May 15, 1984
INVENTOR(S) : Shibamata et al.

It is certified that error appears in the above-identified patent and that said Letters Patent is hereby corrected as shown below:

Column 4, line 26, "mobile" should be --profile,--.

Signed and Sealed this

Twenty-third Day of October 1984

[SEAL]

Attest:

GERALD J. MOSSINGHOFF

Attesting Officer        Commissioner of Patents and Trademarks